(12) United States Patent
Yim et al.

(10) Patent No.: US 6,518,097 B1
(45) Date of Patent: Feb. 11, 2003

(54) METHOD FOR FABRICATING WAFER-LEVEL FLIP CHIP PACKAGE USING PRE-COATED ANISOTROPIC CONDUCTIVE ADHESIVE

(75) Inventors: Myung Jin Yim, Taejeon (KR); Kyung Wook Baik, Taejeon (KR)

(73) Assignee: Korea Advanced Institute of Science and Technology (KR)

( * ) Notice: Subject to any disclaimer, the term of this patent is extended or adjusted under 35 U.S.C. 154(b) by 0 days.

(21) Appl. No.: 09/650,709

(22) Filed: Aug. 29, 2000

(51) Int. Cl.[7] .............................................. H01L 21/44
(52) U.S. Cl. ...................................... 438/119; 438/108
(58) Field of Search ............................... 438/118, 119, 438/458, 108, 613, 15

(56) References Cited

U.S. PATENT DOCUMENTS

| | | | |
|---|---|---|---|
| 5,661,042 A | * 8/1997 | Fang et al. ..................... 438/17 |
| 5,918,113 A | * 6/1999 | Higashi et al. ............. 438/119 |
| 6,039,896 A | * 3/2000 | Miyamoto et al. .......... 252/511 |
| 6,103,553 A | * 8/2000 | Park ............................ 438/119 |
| 6,223,429 B1 | * 5/2001 | Kaneda et al. ................. 29/832 |
| 6,294,405 B1 | * 9/2001 | Higgins, III ................ 438/108 |

* cited by examiner

*Primary Examiner*—David Nelms
*Assistant Examiner*—David Vu
(74) *Attorney, Agent, or Firm*—Madson & Metcalf

(57) ABSTRACT

Disclosed is a method for fabricating wafer-level flip chip packages using anisotropic conductive adhesive. A low-priced non-solder bump, such as a gold stud bump or an electroless nickel/gold bump, is formed on an I/O pad of each chip of a wafer obtained by semiconductor processes. An anisotropic conductive adhesive solution or film is applied onto the wafer, followed by dicing the wafer into individual chips. They are arranged on and heat-pressed against a substrate at 150° C. for 5 min with the aid of a flip chip bonder. Each of the chips is mechanically and electrically connected to the substrate via the anisotropic conductive adhesive. Thus, the method can accomplish low-priced flip chip packaging or chip size packaging simply using conventional packaging lines.

10 Claims, 5 Drawing Sheets

METHOD FOR FABRICATING WAFER-LEVEL FLIP CHIP PACKAGE USING PRE-COATED ANISOTROPIC CONDUCTIVE ADHESIVE

BACKGROUND OF THE INVENTION

1. Field of the Invention

The present invention relates to the fabrication of a wafer-level flip chip package by use of a pre-coated anisotropic conductive adhesive.

2. Description of the Prior Art

Involved in all procedures of the production of final products from semiconductor devices, an electronic packaging technology is a system fabrication methodology covering a wide range of versatile techniques. With great advances in technology in recent years, semiconductor fabrication techniques have enabled the integration of million or more cells, the multiplication of I/O pins, the enlargement of die sizes, the rapid radiation of large amounts of heat, the high electrical performance of semiconductor devices, etc. The electronic packaging technology, which is to encapsulate these semiconductor devices in some form of hermetically sealed package so as to protect them from external or internal damages, however, cannot keep up with the semiconductor fabrication techniques, which make daily progress.

In determining the performance, dimension, price and reliability of a final semiconductor device product, the electronic package technology is one of the most important factors. Extremely small package parts find numerous applications in the computer, information and communication, mobile communication, and high-end household electrical appliance industries for seeking high electrical and electronic performance, slimness/high integration, low power consumption, multi-functionality, high speed signal processing, and permanent reliability. A flip-chip technique, which is generally used to mount a semiconductor chip onto a circuit board, is extending its applications to the fields of smart cards, displays such as LCD and PDP, computers, mobile phones, communication systems, etc. The flip-chip technique, however, has a drawback in that the production efficiency is poor in terms of process complexity and product cost because it requires conventional solder-using complex connection processes, that is, solder flux coating, chip/board arranging, solder bump reflowing, flux removing, underfiller-filling and curing processes.

In order to reduce these complex processes, particular attention has recently been paid to wafer-level packaging techniques in which wafers are coated with polymeric materials having flux and underfiller functions and processed. More recently, in developing new, improved flip-chip connection techniques, advantage has been taken of conductive adhesives, which are of lower price than solders and enable the formation of ultra fine electrode pitches with the potential to realize environmentally-friendly, fluxless processes and low temperature processes.

Consisting fundamentally of conductive particles such as nickel, gold/polymer, silver, etc. and binders such as thermosetting or thermoplastic insulating resins, conductive adhesives are largely divided into anisotropic conductive adhesive/films and isotropic conductive adhesives. There has been a strong demand for the development of a process of producing a low-priced adhesive and a flip-chip bonding process capable of such a low-priced adhesive. In this connection, based on highly curable, thermosetting epoxy resins, anisotropic conductive adhesive (ACA) is developed. ACA can be divided into anisotropic conductive adhesive films (ACAF) and anisotropic conductive adhesive paste (ACAP) in a view of morphology with preference to ACAP owing to its simpler preparation and more convenient use in the connection processes.

In spite of extensive active research, developed flip-chip techniques using these environmentally-friendly anisotropic conductive films or paste as connecting materials suffer from the disadvantage of being inefficient in production costs because of requiring many processes, including chip designing and bump forming processes for package of ACA flip chips, mass production of connecting materials, and automation of connecting processes.

Many prior arts refer to the flip chip techniques relevant to the present invention.

For example, U.S. Pat. No. 5,323,051, titled "Semiconductor Wafer Level Package", issued on Jun. 21, 1994, discloses that a cap wafer is bonded to a semiconductor substrate wafer using a glass adhesive, followed by dicing of the wafer into individual chips. This reference patent is quite different from the present invention in which ACA is applied on a wafer and used for package connection.

U.S. Pat. No. 5,918,113, titled "Process for Producing a Semiconductor Device Using Anisotropic Conductive Adhesive, issued on Jun. 29, 1999, describes the production of a semiconductor device by forming ACA on a circuit board and heat-pressing a semiconductor chip against the circuit board to achieve an electrical connection therebetween. An obvious difference exists between the reference patent and the present invention in which ACA is coated on semiconductor chips with non-solder bumps formed on their I/O pads.

Another technique can be found in S. H. Shi, T. Yamashita and C. P. Wong, "Development of the Wafer Level Compressive-Flow Underfill Process and Its Required Materials", 1999 ECTC, pp. 961–966. In the report, an underfiller having a solder flux function is applied onto a solder bump-formed wafer, which is then diced into individual chips, followed by arranging the chips on a substrate with the help of SMT assembly equipment. Certainly, this process is far simpler than a conventional process of filling an underfiller between the chips and the substrate after the solder reflow connection. On the other hand, the present invention can apply the simplification to wafers on which not only solder bumps, but also non-solder bumps, such as electrolyzed or stud gold bumps and electroless nickel or copper bumps, are formed, by use of ACA. An ACA film or adhesive solution is coated onto a non-solder bump formed semiconductor substrate wafer which is then diced into individual chips, immediately followed by the heat-pressing of the individual chips against the circuit board so that an electrical connection is obtained between the chips and the circuit board via the conductive adhesive.

As mentioned above, electronic packaging technology has the task of developing new electrical connections substituting for conventional solder connections in pursuit of environmentally friendly processes as well as lowered production costs.

SUMMARY OF THE INVENTION

Therefore, it is an object of the present invention to overcome the problems encountered in prior arts and to provide a method for fabricating a wafer-level flip-chip package, which is advantageous in terms of production cost by simplifying the processes subsequent to the fabrication of conventional solder bump flip-chip packages, including solder flux coating, flip chip/substrate arranging, solder reflowing, flux removing, underfiller filling, and curing processes.

Based on the present invention, the above object could be accomplished by a provision of a method for fabricating a wafer-level flip chip package using anisotropic conductive adhesive, comprising the steps of: forming a low-priced non-solder bump on an I/O pad of each chip of a wafer; coating the anisotropic conductive adhesive over the wafer; dicing the anisotropic conductive adhesive-coated wafer into individual chips by use of a wafer dicing machine; and subjecting the individual chips to flip-chip bonding.

BRIEF DESCRIPTION OF THE DRAWINGS

The above and other objects, features and other advantages of the present invention will be more clearly understood from the following detailed description taken in conjunction with the accompanying drawings, in which:

FIG. 1b is a schematic cross sectional view showing the structure of the wafer, taken along the line A—A' of FIG. 1a;

FIG. 2b is a schematic cross sectional view showing the structure of the wafer, taken along the line A—A' of FIG. 2a;

FIG. 3b is a schematic cross sectional view showing the structure of the wafer, taken along the line A—A' of FIG. 3a;

DETAILED DESCRIPTION OF THE PREFERRED EMBODIMENTS

Figure 1A:
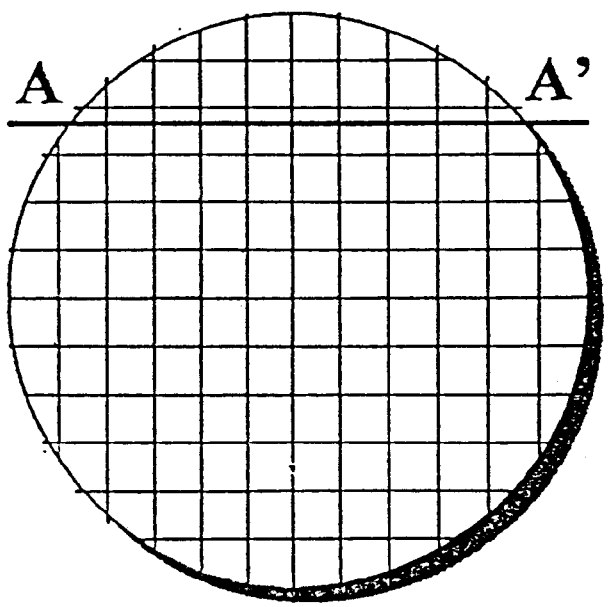
FIG. 1a is a schematic view showing a semiconductor wafer manufactured by a typical semiconductor process.

The present invention pertains to a fabricating method of a wafer level flip chip package at low cost. In this regard, the present invention simplifies the processes necessary for the substrate connection, subsequent to the manufacture of conventional solder bump flip chip packages, such as solder flux coating, flip chip/substrate arranging, solder reflowing, flux removing, underfiller filling, and curing processes. Particularly, the present invention is applied to the wafer level flip chip packages employing non-solder bumps, such as gold stud bumps and electroless Ni/Au bumps.

In accordance with the present invention, anisotropic conductive adhesive, whether in a form of a film or a solution, is applied over the wafer on which such a non-solder bump is formed before dicing of the wafer into individual chips. After being arranged, the diced chips which are thus coated with the conductive adhesive are heat-pressed against a circuit board so that the individual chips are electrically connected via the conductive particles of the anisotropic conductive adhesive and physically bonded via the polymeric resin of the anisotropic conductive adhesive to the circuit board.

The application of the preferred embodiments of the present invention is best understood with reference to the accompanying drawings, wherein like reference numerals are used for like and corresponding parts, respectively.

Embodiments

Figure 1B:
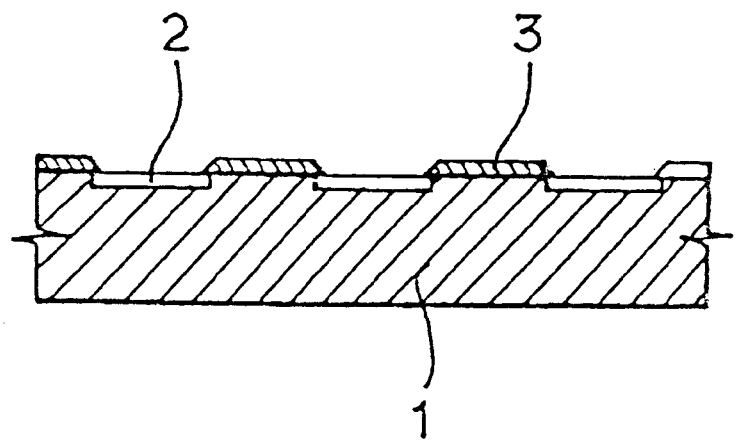

Referring to FIG. 1, there is shown a wafer 1 fabricated by a typical semiconductor process. As shown in FIG. 1, the wafer has many chips mounted thereon, each chip having at least one I/O pad 2 for connecting signals. At a cross-section of each chip, there can be found an Al I/O pad and a passivation layer 3. On the I/O pad of each of chips is formed a low-price non-solder bump.

Non-Solder Bump Formation

Figure 2A:
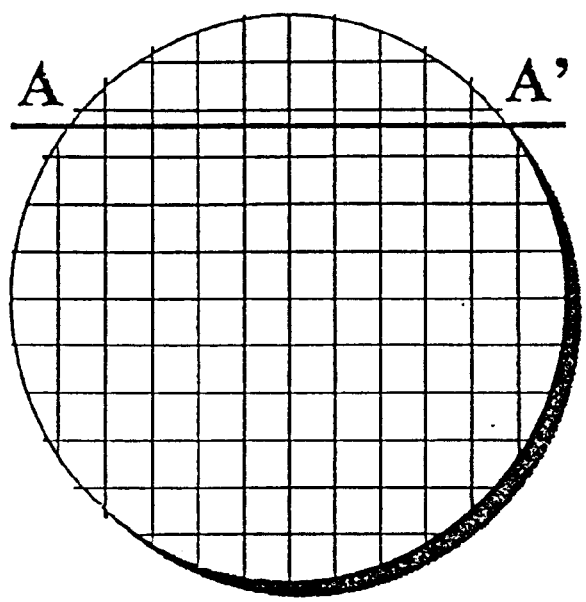
FIG. 2a is a schematic view showing a wafer after an electroless nickel/gold plating process is conducted to form low-priced non-solder bumps.
Figure 2B:
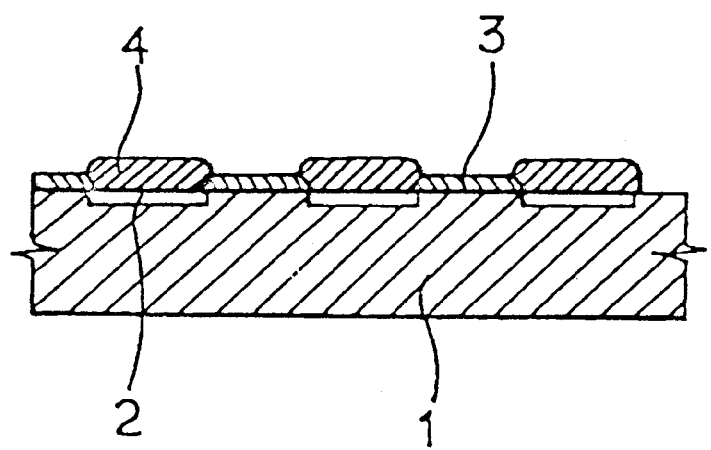

With reference to FIG. 2, there is illustrated the formation of a low-priced non-solder bump 4 on each of wafer chips, according to the present invention. As a non-solder bump, a gold stud bump or a copper bump is useful and formed in an electroless plating process. Typically, a wafer which is fabricated by a semiconductor producing process taking advantage of Al metallization has Al I/O pads thereon.

In order to form gold stud bumps, a gold bonding wire bonder may be used. In the case that an electroless Ni/Au plating method is applied, a treatment with zincate is carried out to activate Al prior to Ni plating. Ni plating is conducted at 90° C. for 20–30 min so as to form a bump height of 10–15 µm. On the other hand, gold is plated at 60° C. for 30 min to prevent the oxidation of nickel.

Anisotropic Conductive Adhesive Coating

Figure 3A:
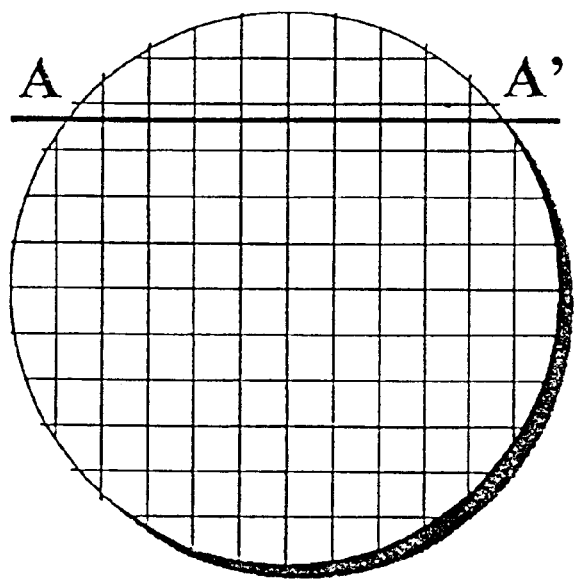
FIG. 3a is a schematic view showing a wafer after an anisotropic conductive adhesive layer is deposited over the bump-formed wafer.
Figure 3B:
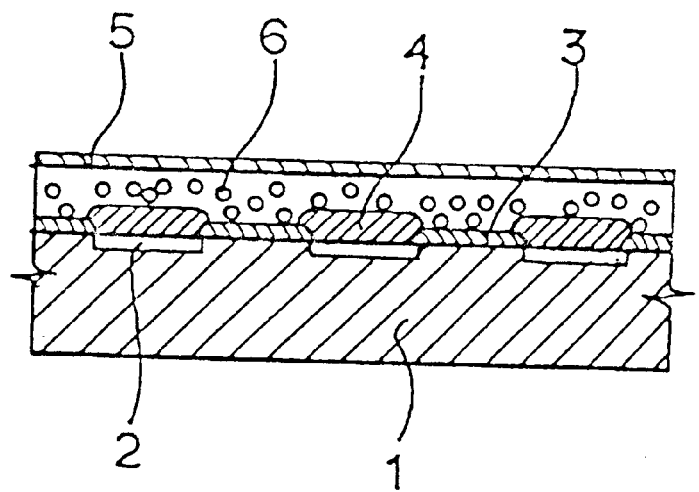

With reference to FIG. 3, an ACA layer 6 is applied over the wafer, followed by the formation of a protective layer 5 on the ACA layer 6. The application of ACA to the bump-formed wafer may be achieved in a spraying, a doctor blade, or a meniscus process using an ACA solution. Alternatively, an ACAF may be employed. The film is laminated on the wafer in a thickness of about 20–25 µm. Against the entire area of the wafer on which low-priced bumps are formed, an ACAF with a thickness of 20–25 µm is pressed at a pressure of 1–2 kgf/cm² at 70–80° C. for 5–10 sec under vacuum. Care must be taken not to create voids therein. Preferably, the ACA resin is in a semi-cure state with a cured portion of 50%. To prepare an ACAF, first, a mixture comprising an epoxy resin in which Ni- or Au-coated polymer balls are embedded in an amount of 2–15 wt %, a solvent, and an imidazole-based curing agent in an amount of 7–10 g per 100 g of the epoxy is applied over a releasable film larger than the wafer in a doctor blading process. The epoxy mixture spread over the releasable film is then heated at 80° C. for 1–2 min in an oven to remove the solvent. The result is an ACAF suitable for use in wafer level packages. The ACAF has the characteristic of being curable at 150° C. within five min. After laminating, it is required to control properties of a lamination apparatus and the film in order to prevent the occurrence of the shadowing, the phenomenon of forming voids around each bump. The lamination is designed to pressurize the film under vacuum. After being withdrawn form the laminator, the wafer is deprived of the releasable film and then, subjected to a dicing process.

Wafer Dicing Process

Figure 4A:
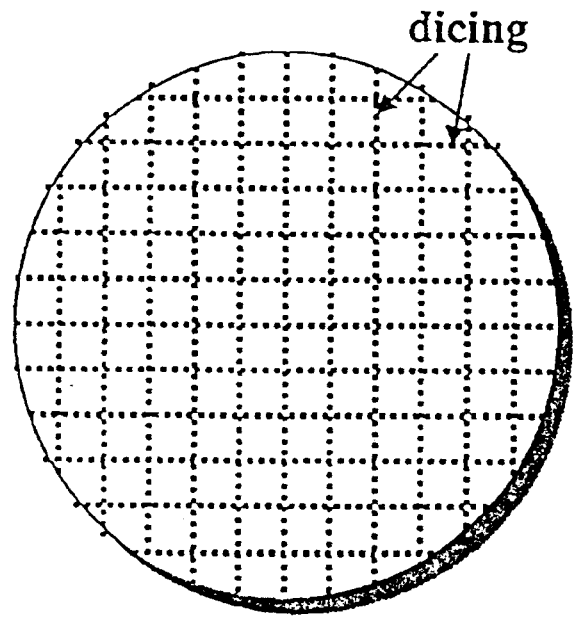
FIG. 4a is a schematic view showing a dicing process.
Figure 4B:
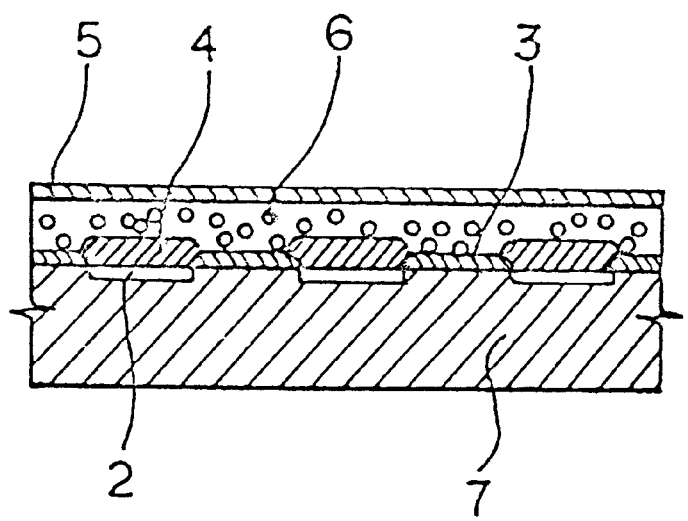
FIG. 4b is a schematic cross sectional view showing a diced chip.

In this process, the wafer with the ACA is mounted on a wafer dicing machine to confirm the scribe line of the wafer, after which the wafer is diced into individual chips 7, as shown in FIG. 4. In this regard, the ACA is required to be transparent. That is, the scribing line and the arrangement pad must be recognized through the ACA in order to enable the dicing of the wafer and the arrangement of individual chips with the substrate for a flip chip process. The ACA coated on the wafer must have such high adhesiveness as not to exhibit delamination in this wafer dicing process. Ni- or Au-coated polymer particles are preferably added in an amount of 2–15 wt % in ACA, so that the ACA is of transparency high enough to enable the inspection of the scribing line and the arrangement of individual chips with the substrate upon dicing and bonding processes. After dicing, each of the chips may be used as a flip chip package.

Flip Chip Connecting Process

Figure 5:
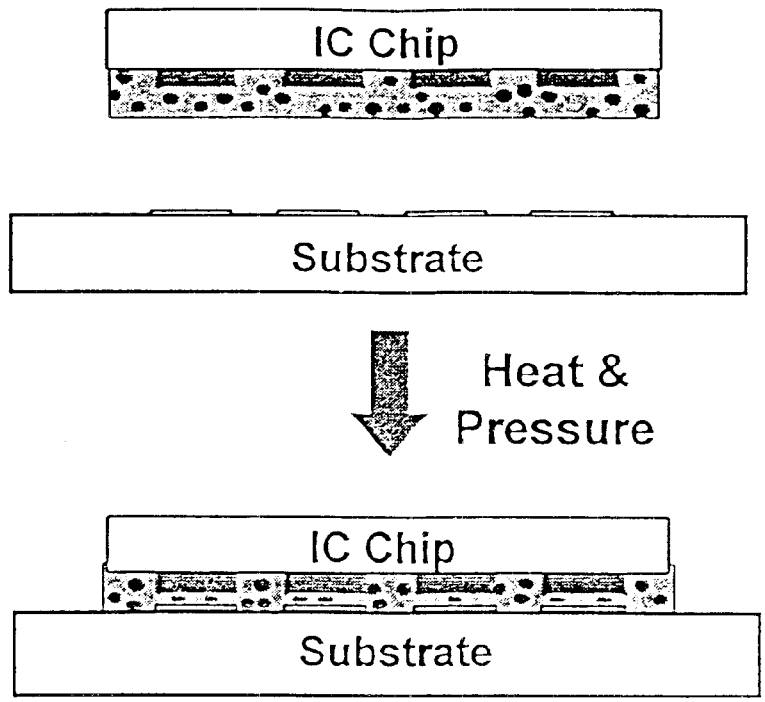
FIG. 5 illustrates a flip chip bonding process in which the individual chips are arranged on and heat-pressed against a substrate to form a mechanical and electrical connection between the chips and the substrate.
Figure 6:
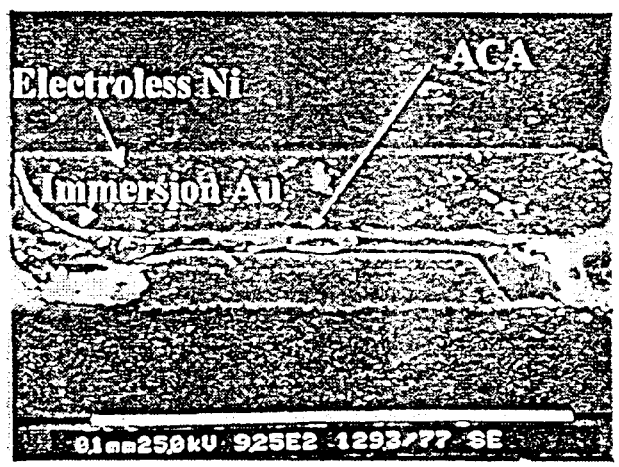
FIG. 6 is a photograph of a flip chip.

Since its one side is coated with ACA, each of the diced chips can be bonded to a substrate only by use of heat and pressure. FIG. 5 illustrates the mechanical and electrical assembly of diced, individual chips and a substrate. After removing the protective layer from the diced chips, as shown in FIG. 5, they are arranged on and heat-pressed against the substrate. The heat pressing is preferably conducted at 150° C. for 5 min with the aid of a flip chip bonder. One of the flip chips is shown in a photograph in FIG. 6.

As described hereinbefore, the wafer-level flip chip package technique using anisotropic conductive adhesive in accordance with the present invention is economically favorable owing to its simplicity and highly added-value. In addition, the technique employs environmentally-friendly processes and thus, can be readily applied in practice.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method for fabricating a wafer-level flip chip package using anisotropic conductive adhesive, consisting of the following steps in order:

forming a low-priced non-solder bump on an I/O pad of each chip of a wafer;

coating the anisotropic conductive adhesive over the wafer;

dicing the anisotropic conducive adhesive-coated wafer into individual chips by use of a wafer dicing machine; and subjecting the individual chips to flip-chip bonding.

2. The method as set forth in claim 1, wherein the low-priced non-solder bump is a gold stud bump or a nickel/gold bump with a thickness of 10–15 μm, the gold stud bump being formed by use of a gold bonding wire, the nickel/gold bump being formed in an electroless plating process in which nickel is plated at 90° C. for 20–30 min and then, gold at 60° C. for 30 min.

3. The method as set forth in claim 1, wherein the anisotropic conductive adhesive is coated with a thickness of about 20–25 μm at a temperature of 70–80° C. at a pressure of 1–2 kgf/cm² for 5–10 sec under vacuum.

4. The method as set forth in claim 1, wherein the anisotropic conductive adhesive coating step is carried out in a spraying, a doctor blading, or a meniscus process using anisotropic conductive adhesive paste or in a lamination manner using anisotropic conductive adhesive films.

5. The method as set forth in claim 1, wherein the anisotropic conductive adhesive is coated as a film, the film being prepared by spreading an adhesive mixture over a releasable film larger than the wafer in a doctor blading process, said adhesive mixture being in a semi-cure state with a cured portion of 50% and comprising an epoxy resin embedded with 2–15% by weight of Ni- or Au-coated polymer balls, a solvent mixture containing 3:1 by volume of toluene:methylethyl ketone, and 7–10 g of an imidazole-based curing agent per 100 g of the epoxy resin, and heating the coated releasable film at 80° C. for 1–2 min in an oven to remove the solvent.

6. The method as set forth in claim 1, wherein the anisotropic conductive adhesive is transparent and has as conductive particles Ni- or Au-coated polymer balls with an average diameter of 5 μm, and the individual chips are arranged on and heat-pressed against the substrate at 150° C. for 5 min with the aid of a flip chip bonder.

7. A method for fabricating a wafer-level flip chip package using anisotropic conductive adhesive, consisting of the following steps in order:

forming a low-priced non-solder bump on an I/O pad of each chip of a wafer, wherein the bump is a gold stud bump or a nickel/gold bump with a thickness of 10–15 μm, the gold stud bump being formed by use of a gold bonding wire, the nickel/gold bump being formed in an electroless plating process in which nickel is plated at 90° C. for 20–30 min and then, gold at 60° C. for 30 min;

coating the anisotropic conductive adhesive over the wafer, wherein the adhesive is coated with a thickness of about 20–25 μm at a temperature of 70–80° C. at a pressure of 1–2 kgf/cm² for 5–10 sec under vacuum;

dicing the anisotropic conductive adhesive-coated wafer into individual chips by use of a wafer dicing machine; and subjecting the individual chips to flip-chip bonding.

8. The method as set forth in claim 7, wherein the anisotropic conductive adhesive coating step is carried out in a spraying, a doctor blading, or a meniscus process using anisotropic conductive adhesive paste or in a lamination manner using anisotropic conductive adhesive films.

9. The method as Set forth in claim 7, the anisotropic conductive adhesive is coated as a film, the film being prepared by spreading an adhesive mixture over a releasable film larger than the wafer in a doctor blading process, said adhesive mixture being in a semi-cure state with a cured portion of 50% and comprising an epoxy resin embedded with 2–15% by weight of Ni- or Au-coated polymer balls, a solvent mixture containing 3:1 by volume of toluene:methylethyl ketone, and 7–10 g of an imidazole-based curing agent per 100 g of the epoxy resin, and heating the coated releasable film at 80° C. for 1–2 min in an oven to remove the solvent.

10. The method as set forth in claim 7, the anisotropic conductive adhesive is transparent and has as conductive particles Ni- or Au-coated polymer balls with an average diameter of 5 μm, and the individual chips are arranged on and heat-pressed against the substrate at 150° C. for 5 min with the aid of a flip chip bonder.

* * * * *